United States Patent
Jeong et al.

(10) Patent No.: US 11,742,859 B2
(45) Date of Patent: Aug. 29, 2023

(54) METHOD AND APPARATUS FOR OPTIMIZING MEMORY POWER

(71) Applicant: SEOUL NATIONAL UNIVERSITY R&DB FOUNDATION, Seoul (KR)

(72) Inventors: Deog Kyoon Jeong, Seoul (KR); Jung Hun Park, Seoul (KR); Kwang Hoon Lee, Seoul (KR); Yong Jae Lee, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 17/558,036

(22) Filed: Dec. 21, 2021

(65) Prior Publication Data
US 2023/0113660 A1    Apr. 13, 2023

(30) Foreign Application Priority Data
Oct. 7, 2021    (KR) .......................... 10-2021-0133311

(51) Int. Cl.
| | | |
|---|---|---|
| H04L 25/49 | (2006.01) | |
| H03K 19/17784 | (2020.01) | |
| H04L 25/03 | (2006.01) | |
| H03K 5/135 | (2006.01) | |
| H03K 19/017 | (2006.01) | |

(52) U.S. Cl.
CPC ....... *H03K 19/17784* (2013.01); *H03K 5/135* (2013.01); *H03K 19/01742* (2013.01); *H04L 25/03878* (2013.01)

(58) Field of Classification Search
CPC ............ H03K 5/135; H03K 19/01742; H03K 19/17784; H04L 25/03878
See application file for complete search history.

(56) References Cited

U.S. PATENT DOCUMENTS

| | | | |
|---|---|---|---|
| 10,749,716 B2* | 8/2020 | Chen ................. | H04L 25/03878 |
| 11,394,589 B1* | 7/2022 | Mayer ............... | H04L 25/03878 |
| 2015/0378603 A1 | 12/2015 | Dearth et al. | |
| 2019/0103143 A1* | 4/2019 | Hasbun ............... | G11C 11/2273 |
| 2021/0167739 A1* | 6/2021 | Hu .......................... | H03F 3/211 |
| 2022/0068332 A1* | 3/2022 | Lee ........................ | G11C 7/222 |
| 2022/0068359 A1* | 3/2022 | Shin ..................... | G11C 11/4076 |
| 2022/0076715 A1* | 3/2022 | Lee ....................... | G11C 7/1006 |

FOREIGN PATENT DOCUMENTS

KR    20170112272    10/2017

* cited by examiner

*Primary Examiner* — Kurtis R Bahr
(74) *Attorney, Agent, or Firm* — Cantor Colburn LLP

(57) ABSTRACT

Provided is a method and an apparatus for optimizing memory power and provide a method and an apparatus for optimizing memory power by minimizing power consumed by pins of a memory by using an SBR pattern. The method of optimizing memory power using a PAM-4 (Pulse-Amplitude Modulation-4) method includes: setting a ratio and sizes of a pull-up transistor and a pull-down transistor included in a driver according to a smallest size of a plurality of eyes included in an eye diagram of a memory; and setting a reference voltage of a sampler and a phase interpolator (PI) digital code value included in the memory by using a signal bit response (SBR) pattern.

14 Claims, 13 Drawing Sheets

METHOD AND APPARATUS FOR OPTIMIZING MEMORY POWER

BACKGROUND

1. Field

Embodiments of the present disclosure relate to a method and an apparatus for optimizing memory power, and more particularly, to a method and an apparatus for optimizing memory power for minimizing power consumption of a plurality of pins in a high-bandwidth memory (HBM).

2. Description of the Related Art

A memory interface generally includes a plurality of pins for inputting an address, inputting and outputting data, selecting read or write, or selecting whether to use a memory. Therefore, a memory interface requires a much larger number of pins compared to a general link.

A high-Bandwidth Memory (HBM) which is one of various memories is a high-performance random access memory (RAM) interface for three-dimensional stacked dynamic random access memory (DRAM). The high-bandwidth memory is used for coupling a high-performance graphics accelerator to a network device. The high-bandwidth memory has higher bandwidth than a graphics double data rate (GDDR)5 memory. In addition, the high-bandwidth memory has a structure in which DRAMs are stacked in a vertical stack structure, and thus, the high-bandwidth memory has a reduced graphics card and may be implemented with a high capacity.

However, since the high-bandwidth memory uses more than a thousand pins, a total power consumption is very high. Therefore, in order to optimize power consumption of the high-bandwidth memory, it is necessary to reduce most the consumed power per pin.

Hereinafter, a structure of an N-over-N driver and problems due to nonlinearity will be described with reference to FIGS. 1 and 2.

FIG. 1 is an example diagram illustrating the structure of the N-over-N driver.

FIG. 2 is an example diagram illustrating a distortion phenomenon in an eye diagram of a driver.

In order to reduce most power consumed by pins of the high-bandwidth memory, the structure of the N-over-N driver structure may be used. The N-over-N driver includes a pull-up transistor and a pull-down transistor composed of NMOS transistors. The N-over-N driver may reduce a supply voltage more than a COMS voltage mode driver. However, when the structure of the N-over-N driver is used, there is a problem that operations of the transistors change nonlinearly according to an output voltage thereof.

In addition, among signal processing methods used in the memory interface, a non-return to zero (NRZ) signal processing method is the most commonly used modulation method in data transmission of the related art. The NRZ signal processing method encodes a series of fixed voltage levels of 0 for a low voltage and 1 for a high voltage.

In addition, a pulse-amplitude modulation-4 (PAM-4) signal processing method divides a least significant bit (LSB) signal in half and adds the divided signal to a most significant blt (MSB) signal. Accordingly, in the PAM-4 signal processing method, four signal levels correspond to 2-bit symbols.

A disadvantage of N-over-N driver that an operation of a transistor is non-linear is more remarkable in the PAM-4 signal processing method using data levels of 0, ⅓, ⅔, and 1 than in the NRZ signal processing method using only the data levels of 0 and 1.

As illustrated in FIG. 1, the N-over-N driver may be treated as a resistor. In this case, a current flowing through the transistor is determined by a gate-source voltage difference and a drain-source voltage difference. A pull-up transistor has a difference in transistor characteristics because the gate-source voltage difference changes according to an output voltage. This difference causes a problem in the PAM-4 signal processing method.

When the PAM-4 signal processing method is applied to the N-over-N driver, an eye diagram consists of three eyes as illustrated in FIG. 2. However, it is difficult to obtain three uniform eyes because resistance of the transistor changes non-linearly depending on which level of data is transmitted (that is, according to the output voltage).

In addition, in the eye diagram, the larger the eye size, the better the digital signal quality, and the smaller the eye size, the lower the digital signal quality. However, the PAM-4 signal processing method using single-ended signaling has a problem in that a size of the uppermost eye is the smallest.

SUMMARY

A method and an apparatus for optimizing memory power according to an embodiment of the present disclosure may secure linearity of an N-over-N driver when a PAM-4 signal processing method is applied to a high-bandwidth memory (HBM) interface.

In addition, a method and an apparatus for optimizing memory power according to an embodiment of the present disclosure may optimize power of an HBM.

However, technical problems to be solved by the present embodiment are not limited to the technical problems described above, and there may be other technical problems.

According to an aspect of the present disclosure, a method for optimizing memory power includes setting a ratio and sizes of a pull-up transistor and a pull-down transistor included in a driver according to a smallest size of a plurality of eyes included in an eye diagram of a memory, and setting a reference voltage and a phase interpolator (PI) digital code value of a sampler included in the memory by using a signal bit response (SBR) pattern.

In addition, the setting of the ratio and the sizes of the pull-up transistor and the pull-down transistor may include sequentially transmitting DC voltages corresponding to data of 00, 01, 10, and 11 from the driver to the sampler, increasing the reference voltage of the sampler and measuring a first output voltage of the sampler corresponding to each of the DC voltages, setting a voltage difference value having a smallest voltage difference of the first output voltage as a first voltage difference value, repeating the measurement of the first voltage difference value by changing the size of the pull-down transistor, and setting the size of the pull-down transistor having a greatest value among the measured first voltage difference values as a size of a final pull-down transistor.

In addition, the setting of the ratio and the size of the pull-up transistor and the pull-down transistor may further include repeatedly measuring a second output voltage of the sampler by changing the size of the pull-up transistor and the reference voltage of the sampler, and setting the size of the pull-up transistor at a point in time when a sign of the second output voltage is inverted to a size of the final pull-up transistor.

In addition, the setting of the reference voltage of the sampler and the phase interpolator (PI) digital code value may further include setting an arithmetic mean value of DC voltage values having a smallest voltage difference of the first output voltage as a first reference voltage, and setting the first reference voltage as a final reference voltage of the sampler.

In addition, the setting of the reference voltage of the sampler and the phase interpolator (PI) digital code value may further include increasing the first reference voltage and measuring a third output voltage value of the sampler according to the SBR pattern, changing the PI digital code value and repeatedly measuring the third output voltage value of the sampler according to the SBR pattern, and setting the PI digital code value having a greatest value among the measured third output voltage values as a final PI digital code value.

In addition, the setting of the reference voltage of the sampler and the phase interpolator (PI) digital code value may further include increasing the first reference voltage value and measuring a fourth output voltage value of the sampler according to the SBR pattern, changing a delay line (DCDL) digital code value and repeatedly measuring the fourth output voltage value of the sampler according to the SBR pattern, and setting the DCDL digital code value having a greatest value among the measured fourth output voltage values as a final DCDL digital code value.

In addition, the setting of the ratio and the sizes of the pull-up transistor and the pull-down transistor may further include setting a ratio and sizes of a pull-up transistor and a pull-down transistor of the feed forward equalizer (FFE), and the setting of the ratio and the sizes of the pull-up transistor and the pull-down transistor of the FFE may include changing the sizes of the pull-up transistor and the pull-down transistor of the FFE while maintaining a difference value between the sizes of the pull-up transistor and the pull-down transistor of the driver, changing the PI digital code value by 64 from the final PI digital code value, repeatedly measuring a fifth output voltage value of the sampler according to the sizes of the pull-up transistor and the pull-down transistor of the FFE and the change of the final PI digital code value, measuring a sum of remaining voltage values excluding a greatest voltage value among the measured fifth output voltage values, and setting the sizes of the pull-up transistor and the pull-down transistor of the FFE corresponding to a case in which the sum of the remaining voltage values is the smallest as a size of the final transistor of the FFE.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
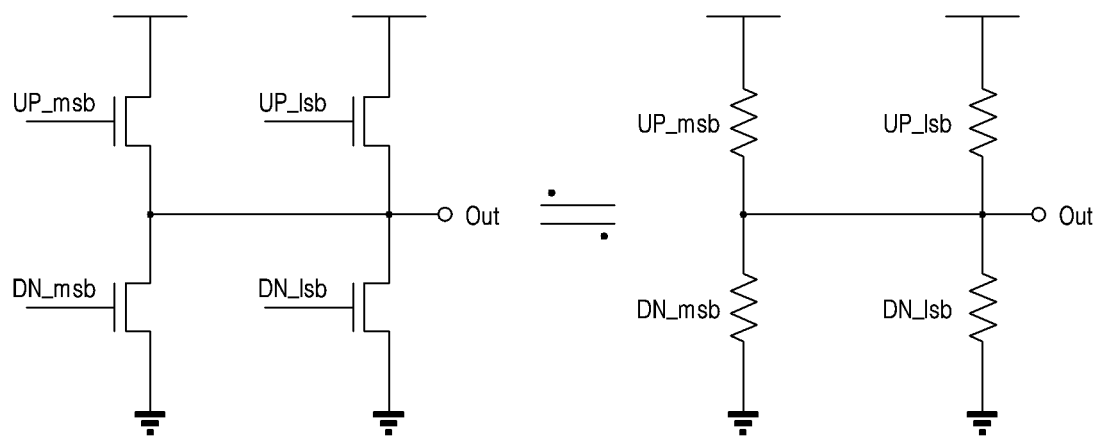
FIG. 1 is an example diagram illustrating a structure of an N-over-N driver.
Figure 2:
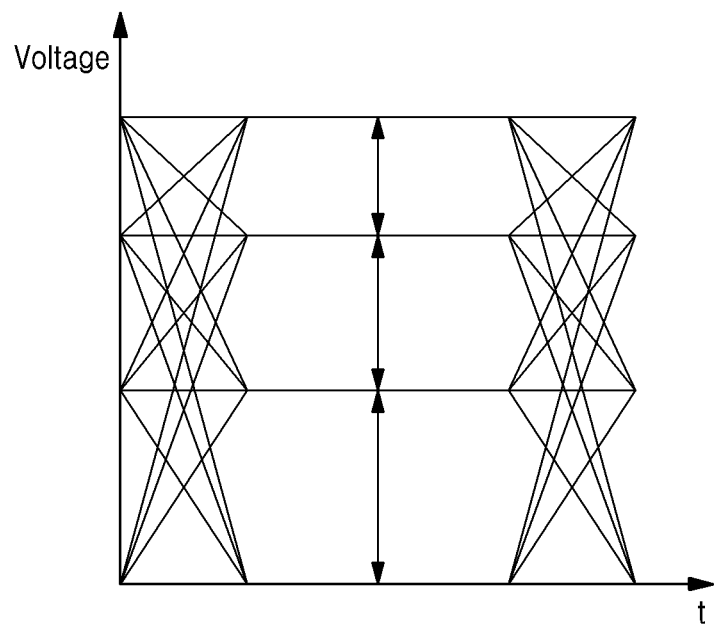
FIG. 2 is an example diagram illustrating a distortion phenomenon in an eye diagram of a driver.

Hereinafter, embodiments of the present disclosure will be described in detail with reference to the accompanying drawings such that those skilled in the art may easily implement the embodiments. However, the present disclosure may be embodied in several different forms and is not limited to the embodiments described herein. In addition, in order to clearly describe the present disclosure, parts irrelevant to the description are omitted in the drawings, and similar reference numerals are attached to similar parts throughout the specification.

Throughout the specification, when a portion is "connected" to another portion, this includes not only a case of being "directly connected" but also a case of being "electrically connected" to another element interposed therebetween. In addition, when a part "includes" a certain component, this means that other components may be further included therein rather than excluding other components unless otherwise stated.

In the present specification, the term "unit" includes a unit implemented by hardware, a unit implemented by software, and a unit implemented by using both. In addition, one unit may be implemented by using two or more pieces of hardware, and two or more units may be implemented by using one piece of hardware. Meanwhile, "~unit" is not limited to software or hardware, and "~unit" may be configured to be in an addressable storage medium or may also be configured to reproduce one or more processors. Accordingly, in one example, "~unit" refers to components such as software components, object-oriented software components, class components, and task components and includes processes, functions, attributes, procedures, subroutines, segments of program codes, drivers, firmware, microcode, circuitry, data, databases, data structures, tables, arrays, and variables. Functions provided in the components and "~units" may be combined into a smaller number of components and "~units" or may be further separated into additional components and "~units". In addition, components and "~units" may also be implemented to recover one or more central processing units (CPUs) in a device.

In addition, the accompanying drawings are only for easy understanding of the embodiments disclosed in the present specification, and the technical idea disclosed herein is not limited by the accompanying drawings, and should be understood to include all changes, equivalents, or substitutes included in the idea and scope of the present disclosure.

Terms including an ordinal number, such as first, second, and so on may be used to describe various components, but the components are not limited by the terms. The above terms are used only for the purpose of distinguishing one component from another component.

When it is described that a component is "connected" or "coupled" to another component, it should be understood that the component may be directly connected or coupled to another component, but other components may exist therebetween. Meanwhile, when it is described that a certain component is "directly connected" or "directly coupled" to another component, it should be understood that other elements do not exist therebetween.

The singular expression includes the plural expression unless the context clearly dictates otherwise.

In the present application, terms such as "include" or "have" are intended to designate that there are features, numbers, steps, operations, configuration elements, component, or combinations thereof described in the specification, and it should be understood that the present disclosure does not preclude possibility of addition or existence of one or more other features, numbers, steps, operations, configuration elements, components, or combinations thereof.

Hereinafter, a configuration of an apparatus 1 for optimizing memory power according to an embodiment will be described with reference to FIG. 3.

Figure 3:
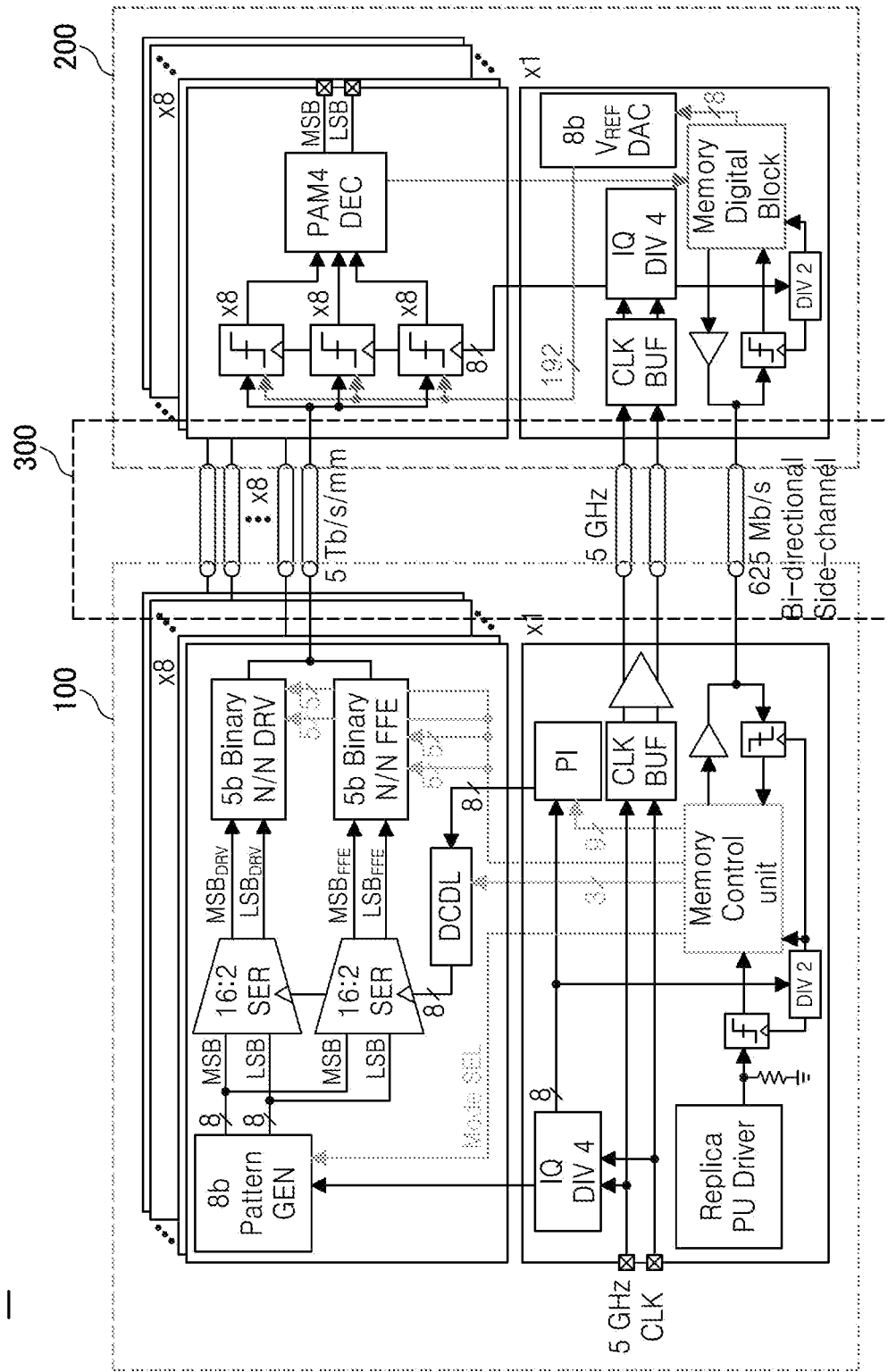
FIG. 3 is a configuration diagram of an apparatus for optimizing memory power according to an embodiment.

FIG. 3 is a configuration diagram of an apparatus for optimizing memory power according to an embodiment.

Referring to FIG. 3, the apparatus 1 for optimizing memory power includes a memory controller 100 controls all operations of a memory 200, the memory 100, and a channel 300 through which the memory controller 100 communicates with the memory 200.

The memory controller 100 includes eight data channels. Accordingly, the memory controller 100 includes eight identical data paths. In addition, the respective data channels and the respective data paths are connected to the memory 200 through the channel 300. The memory 200 may recognize data transmitted from the memory controller 100 to set voltages of a plurality of pins included in the memory or to perform input/output of data and read or write of data.

The memory controller 100 and the memory 200 may transmit and receive data through the channel 300. In addition, data transmitted and received through the channel 300 may include training data for optimizing power of the memory.

Hereinafter, a configuration of the memory controller 100 according to the embodiment will be described with reference to FIG. 4.

Figure 4:
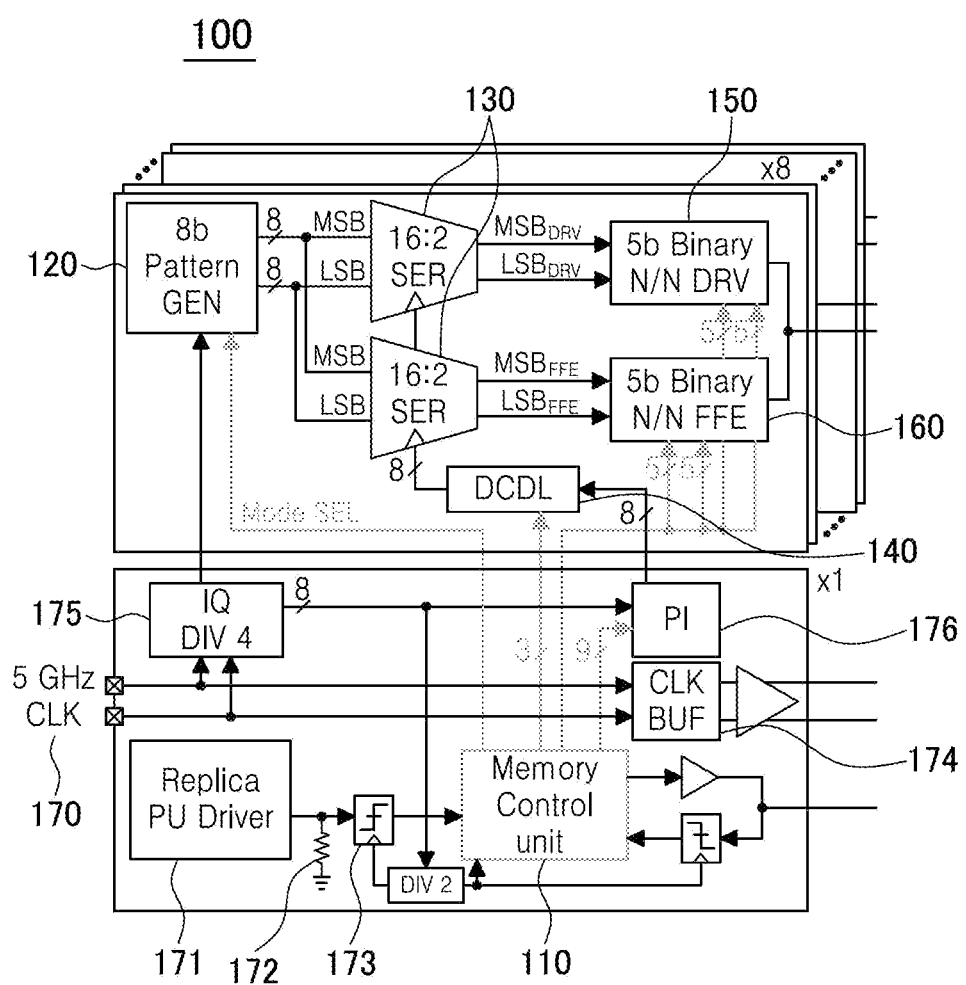
FIG. 4 is a configuration diagram of a memory controller according to an embodiment.

FIG. 4 is a configuration diagram of the memory controller according to the embodiment.

Referring to FIG. 4, the memory controller 100 includes a memory control unit 110 that controls the memory controller 100, eight data channels, and data paths corresponding to the eight data channels. In addition, the data paths corresponding to the eight data channels are composed of an 8-bit pattern generator 120, two 16:2 serializers 130, a delay line (DCDL) 140 controllable with a 3-bit digital signal, an N-over-N driver 150 controllable with five bits, and a feed forward equalizer (FFE) 160 having the same structure as the driver but different in size.

That is, the memory controller 100 includes a data path composed of the 8-bit pattern generator 120, the two 16:2 serializers 130, the delay line 140, the N-over-N driver 150, and the FFE 160. In addition, there are eight data paths corresponding to the eight data channels. In addition, each of the eight data paths is connected to the memory 200 through the channel 300.

The 8-bit pattern generator 120 outputs eight parallel patterns at a rate of 1.25 Gb/s. The 8-bit pattern generator 120 generates a total of 16 bits of 8 bits of most significant bit (MSB) and 8 bits of least significant bit (LSB) for PAM-4 signal processing. In addition, the 8-bit pattern generator 120 may generate a pseudo random bit sequence (PRBS) pattern for random pattern measurement, a DC pattern used for optimizing memory power, and a single bit response (SBR) pattern. The output patterns generated by the 8-bit pattern generator 120 may be controlled by the memory control unit 110.

The 16:2 serializer 130 serializes 8 bits of MSB and 8 bits of LSB of 1.25 Gb/s generated by the 8-bit pattern generator 120 to generate MSB and LSB of 10 Gb/s. In addition, there are two 16:2 serializers 130. One of the two 16:2 serializers 130 is connected to the N-over-N driver 150, and the other is connected to the FFE 160.

The 16:2 serializer 130 used in the N-over-N driver 150 and the 16:2 serializer 130 used in the FFE 160 have the same structure. However, the FFE 160 uses data delayed by 1 unit interval (UI) more than the N-over-N driver 150. Accordingly, the 16:2 serializer 130 used in the FFE 160 generates an output delayed by 1 UI more than the 16:2 serializer 130 used in the N-over-N driver 150.

To describe a structure of the 16:2 serializer 130 in more detail, the 16:2 serializer 130 includes two 8:1 serializers. Thus, the two 8:1 serializers respectively serialize the MSB and the LSB.

The 8:1 serializer receives an 8-phase clock and generates eight pulses with a width equal to a difference between adjacent phases. Then, data information is sequentially included in the respective pulses to be serialized. For example, data 0 is transmitted when a pulse between clock 0 and clock 1 is 1, and data 1 is transmitted when a pulse between clock 1 and clock 2 is 1.

In addition, the 16:2 serializer 130 used in the FFE 160 uses the next phase of a clock of the 16:2 serializer 130 used in the N-over-N driver 150. Accordingly, the 16:2 serializer 130 used in the FFE 160 outputs data delayed by 1 UI more than the 16:2 serializer 130 used in the N-over-N driver 150. For example, data 0 is transmitted when a pulse between clock 1 and clock 2 is 1, and data 1 is transmitted when a pulse between clock 2 and clock 3 is 1.

In addition, eight data channels included in the memory controller 100 may have different lengths of data paths. Accordingly, in the eight data channels, a time difference may occur between data, according to a difference in data path length. In order to compensate for such a time difference, the delay line (DCDL) 140 controllable by a 3-bit digital signal is added to the clock used in the 16:2 serializer 130. The delay line 140 is controlled by using the memory control unit 110.

The N-over-N driver 150 and the FFE 160 have the same structure. However, a size of a transistor in the FFE 160 is smaller than a size of a transistor size in the N-over-N driver 150. In general, the N-over-N driver 150 includes two pull-up NMOS transistors (MSB and LSB) and two pull-down NMOS transistors (MSB and LSB). In the process of optimizing memory power, sizes of the pull-up NMOS transistors and the pull-down NMOS transistors have to be changeable. Accordingly, each NMOS transistor may be divided into five NMOS transistors having a binary size, and serial NMOS switches may be added thereto to turn on or turn off the five NMOS transistors.

The memory control unit 110 controls the pull-up NMOS transistors and the pull-down NMOS transistors by using a 5-bit digital signal. The NMOS transistor for MSB and the NMOS transistor for LSB constantly maintain the same size. Accordingly, the control unit 110 controls the NMOS transistors (the pull-up NMOS transistors and the pull-down NMOS transistors) by using a digital signal of a total of 10 bits. That is, the memory control unit 110 outputs a 10-bit signal for adjusting strength of the N-over-N driver 150 and a 10-bit signal for adjusting strength of the FFE 160.

In addition, the memory controller 100 includes a set of clocks and side channels 330 per eight data channels, and a block for ZQ calibration. The block for ZQ calibration includes a replica PU driver 171, a resistor 172, and a sampler 173.

A clock path is as follows. A differential clock of 5 GHz generated by a 5-GHz clock generator 170 is input to a clock buffer 174. The clock buffer 174 buffers the differential clock of 5 GHz and transmits the buffered differential clock to the memory 200.

In addition, in order to be used for data transmission and optimization of memory power, an IQ divider 175 converts the clock of 5 GHz to a clock of 1.25 GHz having eight phases. The converted clocks are transmitted to the 16:2 serializer 130 through a phase interpolator (PI) 176.

One of the clocks that do not pass through the phase interpolator 176 is used for the 8-bit pattern generator 120. In addition, the clocks that do not pass through the phase interpolator 176 are divided in half and converted into a clock of 625 MHz. The converted clocks of 625 MHz are used for the memory control unit 110, the side channel 330, and the ZQ calibration block.

Hereinafter, a configuration of the memory 200 according to the embodiment will be described with reference to FIG. 5.

Figure 5:
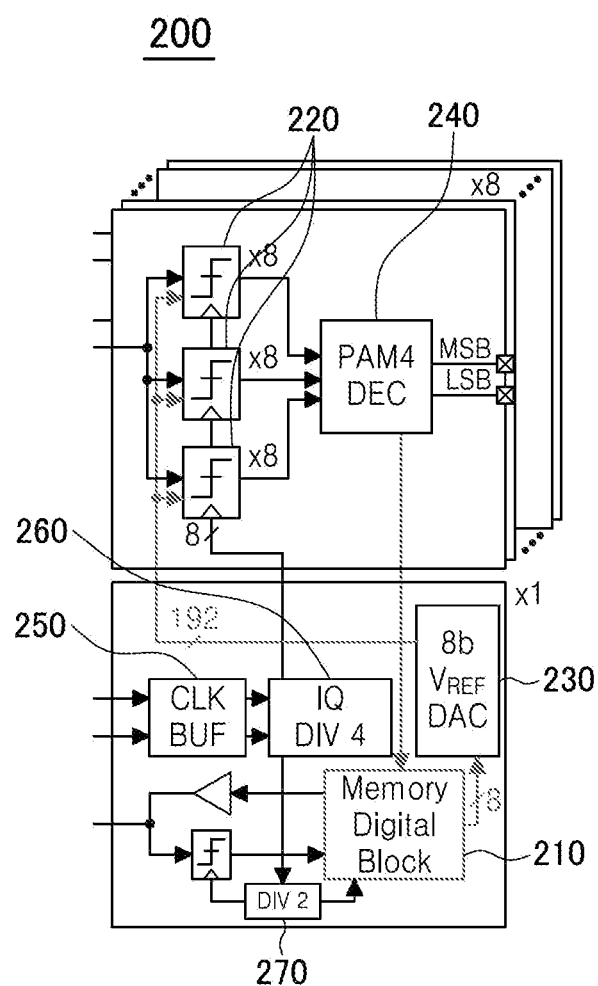
FIG. 5 is a configuration diagram of a memory according to an embodiment.

FIG. 5 is a configuration diagram of a memory according to an embodiment.

Referring to FIG. 5, a memory digital block 210 performs overall control of components included in the memory 200. Data transmitted from the memory controller 100 is recognized by a sampler 220 of the memory 200. A receiver using a PAM-4 signal processing requires three samplers 220, each having reference voltages of high, mid, and low. The samplers sample input data by using a reference voltage and a clock signal.

During the PAM-4 signal processing, the sampler 220 samples a signal in 8 phases. That is, there may be required eight samplers, each having reference voltages of high, mid, and low. Accordingly, 24 samplers 220 per one channel are required. In addition, the memory controller 100 has eight data channels. Accordingly, the memory 200 uses a total of 192 samplers 220. That is, the memory 200 uses 24 samplers 220 per one channel and has 8 channels, thereby including a total of 192 samplers 220.

The reference voltages used by the samplers 220 are generated by an 8-bit digital to analog converter (DAC) 230. The reference voltages generated by the 8-bit DAC 230 is controlled by the memory digital block 210.

The 192 samplers 220 are connected to 64 PAM-4 decoders 240 that convert 3-bit signals transmitted by the three samplers 220 into 2-bit signals of a PAM-4 signal processing method. The decoded signal generated by the PAM-4 decoder 240 may be transmitted to the memory digital block 210 of the memory 200. Accordingly, the PAM-4 decoder 240 may perform optimization of memory power by using the decoded signal or transmit the decoded signal to the memory control unit 110.

In addition, the memory 200 uses a clock transmitted from the memory controller 100 (clock forwarded system). The clock buffer 250 buffers a differential clock of 5 GHz received from the memory controller 100. The buffered clock is converted into an 8-phase clock through the IQ divider 260. The converted 8-phase clock is used for the sampler 220. In addition, one of the converted 8-phase clocks is divided to half in speed by a divider 270. The clock divided to a half speed is used for the memory digital block 110 and the side channel 330.

Hereinafter, a configuration of the channel 300 according to the embodiment will be described with reference to FIG. 6.

Figure 6:
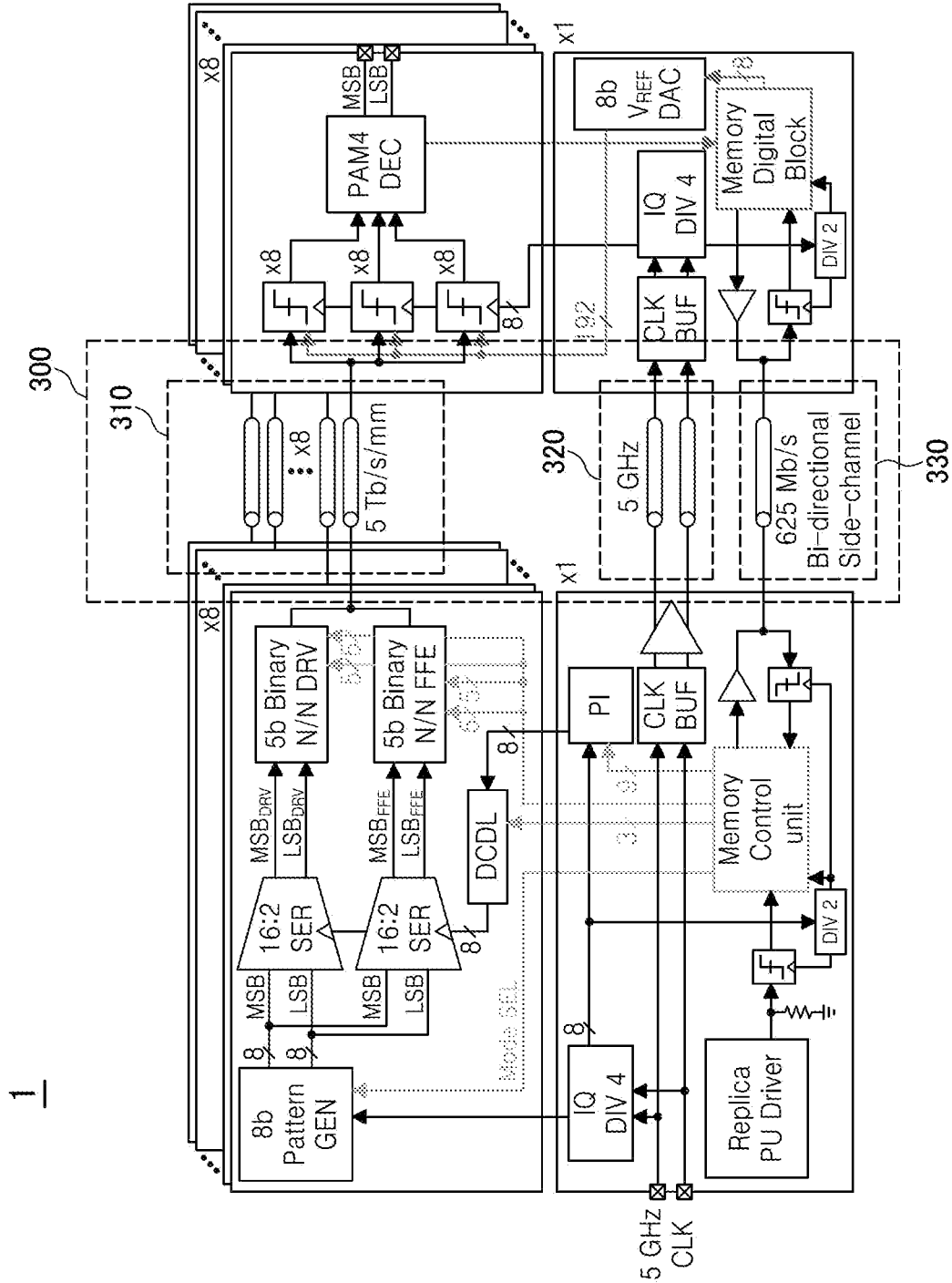
FIG. 6 is a configuration diagram of a channel according to an embodiment.

FIG. 6 is a configuration diagram of a channel according to an embodiment.

Referring to FIG. 6, the channel 300 includes eight data channels 310, two clock channels 320, and one side channel 330.

The eight data channels 310 enable data communication between eight data channels included in the memory controller 100 and the memory 200. Specifically, the data channel 310 transmits data signals generated by the N-over-N driver 150 and the FFE 160 to the sampler 220 of the memory 200.

In addition, the two clock channels 320 transmit a clock of the memory controller 100 to the memory 200. Specifically, the two clock channels 320 transmit clocks generated by the clock buffer 174 of the memory controller 100 to the clock buffer 250 of the memory 200.

The side channel 330 enables data communication between the memory control unit 110 and the memory digital block 210. Specifically, the side channel 330 enables bidirectional communication at a rate of 625 Mb/s. To this end, a driver and a sampler connected to the side channel 330 are respectively provided in the memory controller 100 and the memory 200. In addition, an input and an output of the side channel 330 are controlled by the memory digital block 210. Accordingly, the memory control unit 110 and the memory data block 210 may perform optimization of memory power and transmit and receive data through the side channel 330.

Hereinafter, a method for optimizing memory power according to an embodiment will be described with reference to FIGS. 7 to 14.

Figure 7:
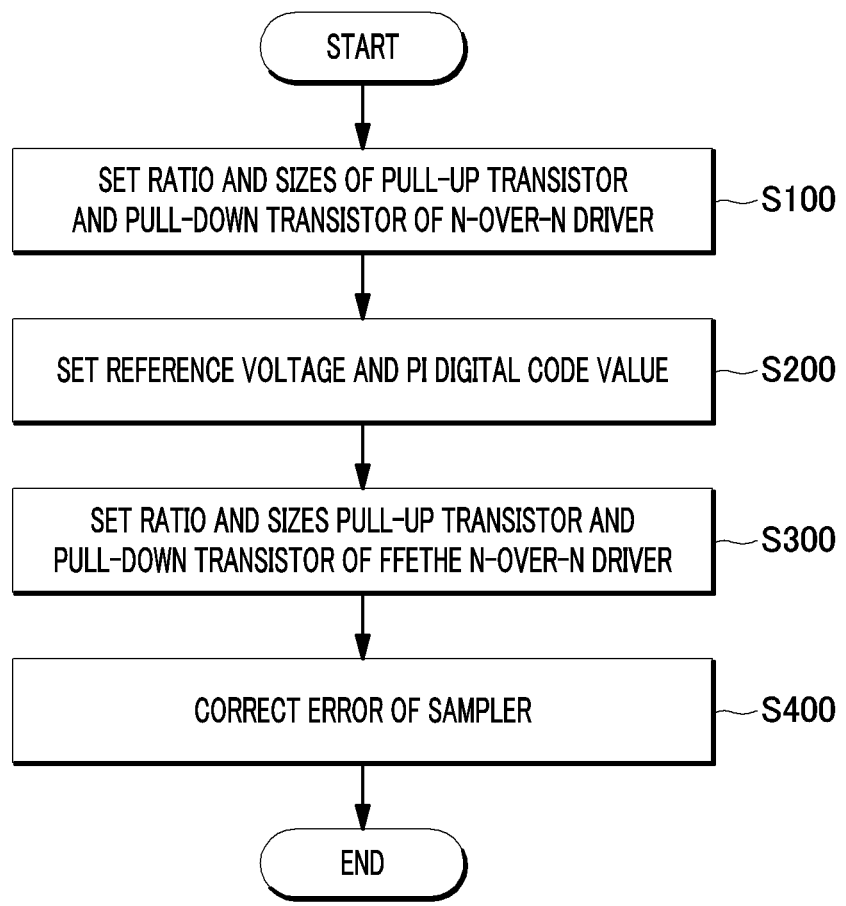
FIG. 7 is a flowchart of a method for optimizing memory power, according to an embodiment.

FIG. 7 is a flowchart of the method for optimizing memory power according to the embodiment.

Referring to FIG. 7, the method for optimizing memory power according to the embodiment includes a step of setting sizes of transistors in the N-over-N driver 150 and the FFE 160 and setting a reference voltage of the sampler 220 and a phase interpolator (PI) digital code value. Accordingly, power consumption of pins included in the memory is greatly reduced.

Specifically, in step S100, the memory control unit 110 sets a ratio and sizes of a pull-up transistor and a pull-down transistor of the N-over-N driver 150. Specifically, the ratio and sizes of the pull-up transistor and the pull-down transistor of the N-over-N driver 150 are set according to minimum sizes of a plurality of eyes included in an eye-diagram.

In this case, as described above, the pull-up transistor and the pull-down transistor are each composed of two NMOS transistors MSB and LSB. In addition, each NMOS transistor is composed of five NMOS transistors having a binary size.

Accordingly, the memory control unit 110 turns on and turns off the five NMOS transistors having the binary size included in the N-over-N driver 150 by using a 5-bit control signal to set a ratio and a size of the transistors. A specific method for setting sizes of the pull-up transistor and the pull-down transistor will be described in detail with reference to FIGS. 8 to 11 to be described below.

In addition, in step S200, the memory digital block 210 sets a reference voltage of the sampler 220 and a PI digital code value by using a signal bit response (SBR) pattern. Step S200 may correspond to an eye centering step in which the clock of the sampler 220 is located in the center of an eye diagram. A method for setting the reference voltage of the sampler 220 and the PI digital code value will be described in detail with reference to FIGS. 12 and 13 to be described below.

In step S300, the memory control unit 110 sets a ratio and sizes of transistors in the FFE by using the set values of the pull-up transistor and the pull-down transistor of the N-over-N driver 150. A method for setting sizes of the pull-up transistor and the pull-down transistor of the FFE will be described in detail with reference to FIG. 14 to be described below. In addition, in step S100 to step S300, only one sampler is used for each channel. In addition, when a training process for one channel is finished, training of the next channel is performed, and thus, a total of eight iterations are performed.

In step S400, the memory control unit 110 and the memory digital block 210 correct errors of the sampler 220. As described above, the memory 200 includes eight channels, and one channel includes 24 samplers. In step S200, only three reference voltages are set. Accordingly, errors between different samplers may occur.

Accordingly, in step S400, the N-over-N driver 150 transmits a constant DC voltage, and an output voltage is measured while changing the reference voltages used for the 24 samplers 220. In this case, when there is an error in the sampler, an output value is measured differently according to the error.

In order to correct the error of the sampler 220, the three reference values set in step S200 are set as the reference voltages of the three samplers 220. In addition, the remaining 21 samplers reflect a difference between the output values to the reference voltage value set in step S200, and thus, the final reference voltage of the sampler 220 is set.

For example, it is assumed that the reference voltage of the sampler corresponding to a high level corresponds to 200 in the digital code. In this case, the same DC voltage is transmitted to the eight samplers of eight phases, and the output values of the samplers 220 are measured by changing the reference voltages of the eight samplers 220. When the measured output values of the samplers 220 are 100, 105, 102, 98, 95, 100, 103, and 107, the final reference voltages of the eight samplers 220 are 200, 205, 202, 198, 195, 200, 203, and 207 in the digital code.

In step S400, when correction of the reference voltage of the sampler 220 for one channel is completed, corrections of the reference voltages for the other channels are performed. Accordingly, in step S400, a total of eight reference voltage correction steps are repeated.

Hereinafter, a method for setting a ratio and sizes of transistors in the N-over-N driver 150 according to the embodiment will be described with reference to FIGS. 8 to 10.

Figure 8:
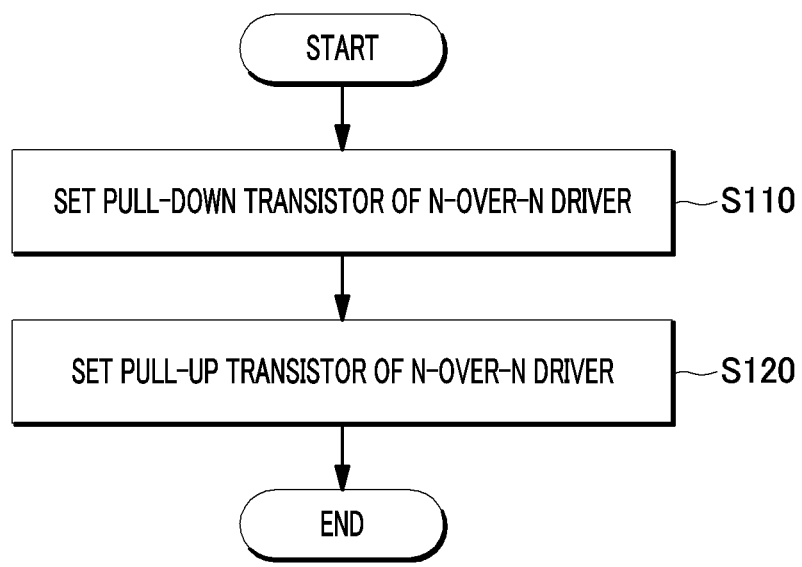
FIG. 8 is a flowchart of a method for setting a transistor in an N-over-N driver, according to an embodiment.

FIG. 8 is a flowchart of a method for setting a transistor in an N-over-N driver according to an embodiment.

Figure 9:
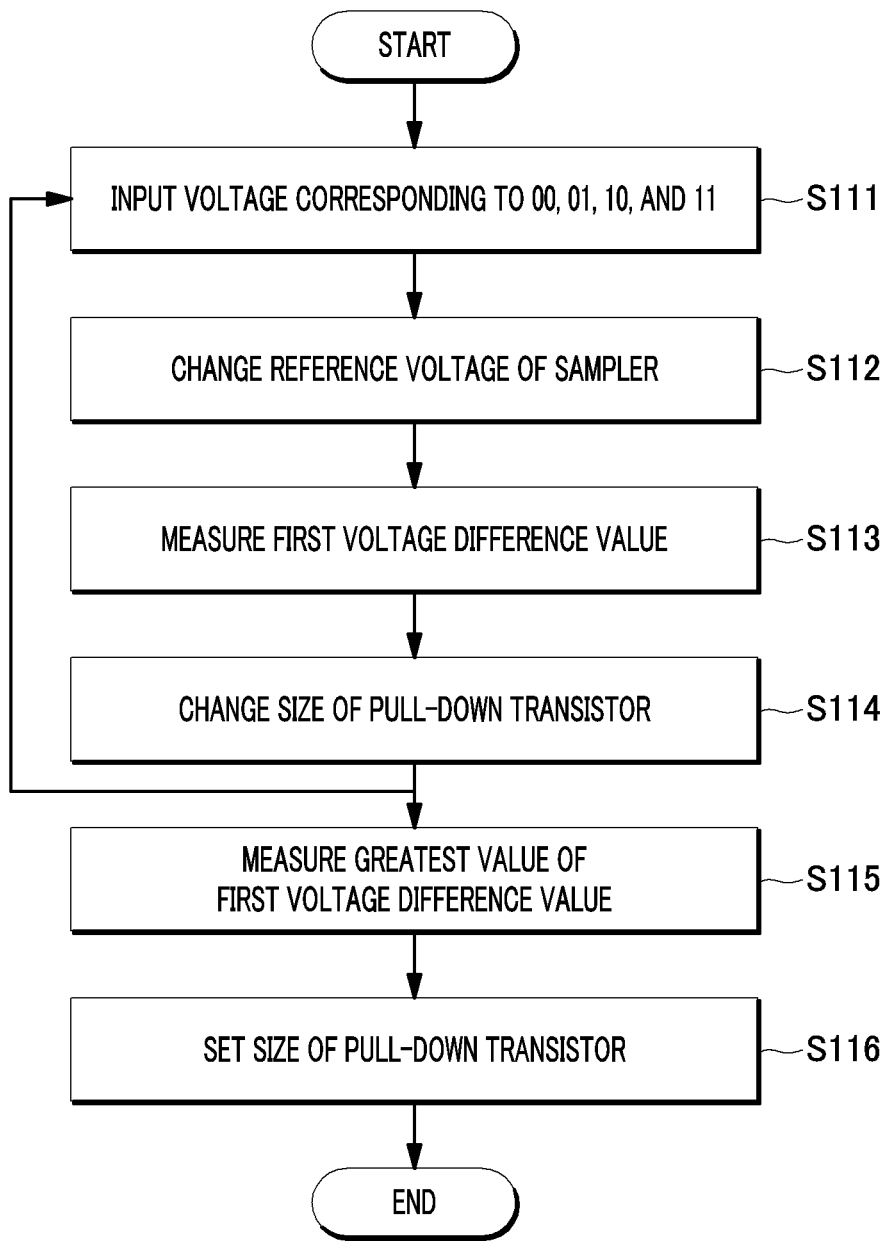
FIG. 9 is a flowchart of a method for setting a pull-down transistor of an N-over-N driver, according to an embodiment.

FIG. 9 is a flowchart of a method for setting a pull-down transistor in the N-over-N driver according to an embodiment.

Figure 10:
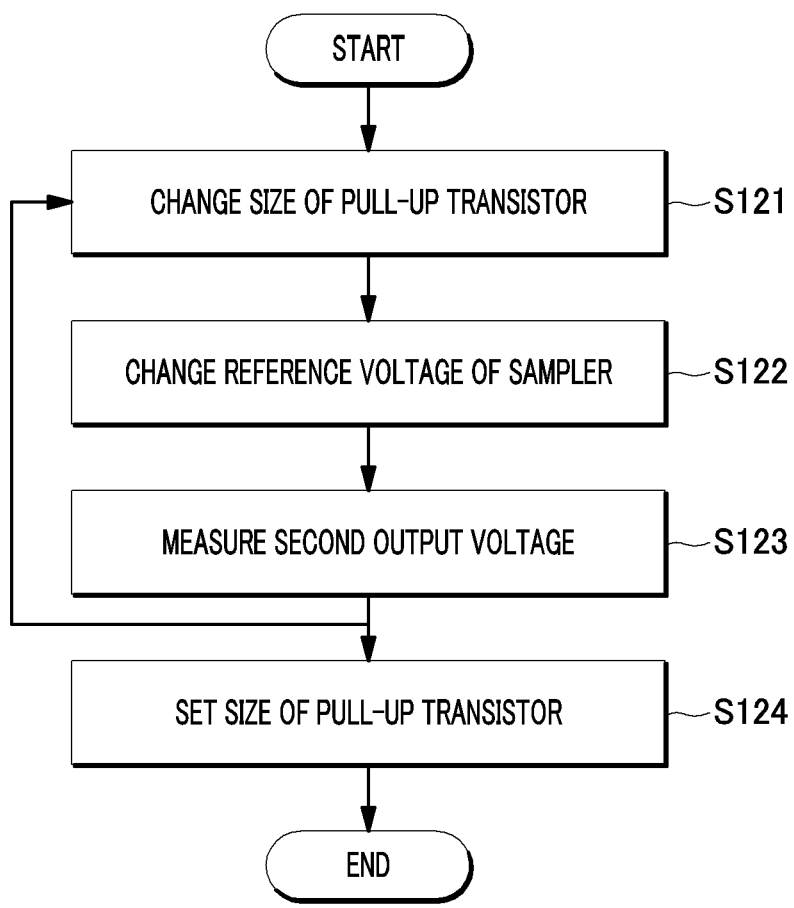
FIG. 10 is a flowchart of a method for setting a pull-up transistor of in the N-over-N driver, according to an embodiment.

FIG. 10 is a flowchart of a method for setting a pull-up transistor in the N-over-N driver according to an embodiment.

Referring to FIG. 8, step S100 includes step S110 of setting a size of a pull-down transistor in the N-over-N driver 150 and step S120 of setting a size of ae pull-up transistor in the N-over-N driver 150. In step S110, the memory control unit 110 sets the size of the pull-down transistor in the N-over-N driver 150 by performing a series of steps illustrated in FIG. 9.

Referring to FIG. 9, in step S111, the size of the pull-down transistor in the N-over-N driver 150 is minimized. In addition, a reference voltage used in the sampler 220 is initialized to 0 (GND).

In addition, in step S111, the N-over-N driver 150 sequentially transmits DC voltages corresponding to data of 00, 01, 10, and 11 to the sampler 220. That is, the same data is repeatedly transmitted to the sampler 220. In this case, whenever the DC voltage is transmitted to the sampler 220, the memory control unit 110 notifies the memory digital block 210 of the transmission fact through the side channel 330.

In step S112, the reference voltage of the sampler 220 is increased, and in step S113, a first output voltage of the sampler 220 corresponding to each DC voltage is measured. Specifically, the memory digital block 210 increases the reference voltage of the sampler 220 and determines that a point at which an output of the sampler 220 changes is an input DC voltage.

The input DC voltage value determined by the memory digital block 210 is transmitted to the memory control unit 110 through the side channel 330. In addition, four DC levels of 00, 01, 10, and 11 are transmitted, and thus, steps S112 and S113 are repeated four times. After an output value of the sampler for the last 11 data values among the DC levels is measured, the memory digital block 210 initializes the reference voltage of the sampler 220 to zero.

That is, in step S112, the memory digital block 210 increases the reference voltage of the sampler 220 and measures the first output voltages corresponding to the four DC levels.

In addition, in step S113, the memory control unit 110 calculates a difference between the output voltages of the sampler 220 corresponding to the four DC levels and stores the smallest value as a first voltage difference value. That is, a voltage difference value having the smallest difference between the measured first output voltages of the sampler 220 is set as a first voltage difference value.

In step S114, the size of the pull-down transistor in the N-over-N driver 150 is changed. Accordingly, the first voltage difference value according to the size change of the pull-down transistor is repeatedly measured. That is, the size of the pull-down transistor of the N-over-N driver 150 is changed, and step S111 to step S114 are repeated. In step S115, the greatest value of the first voltage difference values is measured.

Then, in step S116, a size of the pull-down transistor having the greatest value among the measured first voltage difference values is set as a final pull-down transistor size. When the sizes of the pull-up transistor and the pull-down transistor are set according to the above-described process, a size of the driver is set such that the uppermost eye of the eye diagram is the largest.

A method for setting the size of the pull-up transistor in the N-over-N driver 150 will be described with reference to FIG. 10. A process of determining the size of the pull-up transistor in the N-over-N driver 150 may correspond to a ZQ calibration process.

As described above, when the size of the pull-down transistor in the N-over-N driver 150 is set, a ratio of the pull-down transistor to the pull-up transistor is regarded as determined. Accordingly, ZQ calibration refers to a process of setting the size of the pull-up transistor in the N-over-N driver 150.

Specifically, the replica PU driver 171 of the memory controller 100 is the same as replica of only the pull-up transistor of the N-over-N driver 150. Accordingly, in step S121, a size of the transistor of the replica PU driver 171 is changed. In addition, in step S122, the memory digital block 210 changes the reference voltage of the sampler 220.

In step S123, a second output voltage output from the sampler 220 is measured. Specifically, when the resistor 172 having specific impedance is connected to an output of the replica PU driver 171, a specific output voltage is set to be derived. In this case, the specific output voltage is derived to a point where a sign of the output voltage of the sampler 220 is inverted by changing the reference voltage of the sampler 220.

That is, the size of the transistor in the replica PU driver 171 and the reference voltage of the sampler 220 are changed according to step S121 and step S122. In addition, in step S123, an output voltage of the sampler 220 is measured as the second output voltage.

In addition, the size of the transistor in the replica PU driver 171 corresponding to a point in time when a sign of the second output voltage is inverted in step S124 is set to a size of the final pull-up transistor in the N-over-N driver 150.

Figure 11:
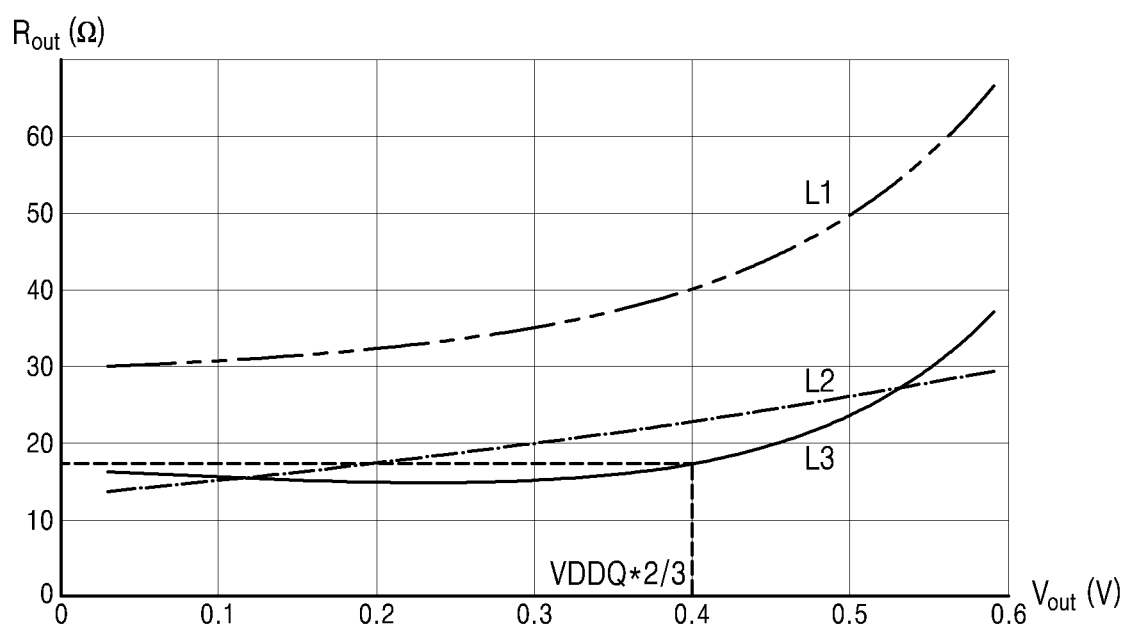
FIG. 11 is a driver resistance graph according to an embodiment.

FIG. 11 is a graph illustrating nonlinearity characteristics of a driver resistance. Referring to FIG. 11, an x axis represents an output voltage, and a y axis represents a transistor resistance value. In addition, L1 represents a resistance RUP of the pull-up transistor, L2 represents a resistance RDN of the pull-down transistor, and L3 represents a difference RUP-RDN between resistances of the pull-up transistor and the pull-down transistor.

As illustrated in FIG. 11, when a voltage value of the driver is referred to as VDDQ, a difference between the resistance RUP of the pull-up transistor and the resistance RDN of the pull-down transistor rapidly is increased above ⅔ VDDQ. Accordingly, when a range of the output voltages is maintained below ⅔ VDDQ, a relatively uniform eye may be derived from the eye diagram.

Accordingly, when the sizes of the pull-up transistor and the pull-down transistor in the N-over-N driver 150 are set according to the above-described process, the range of the output voltages is maintained below ⅔ VDDQ. Accordingly, it is possible to set a size of the smallest eye in the eye diagram to be the greatest by adjusting the size of the output voltage.

Hereinafter, a method for setting a reference voltage of a sampler and a method for setting a PI digital code according to an embodiment will be described with reference to FIGS. 12 and 13.

Figure 12:
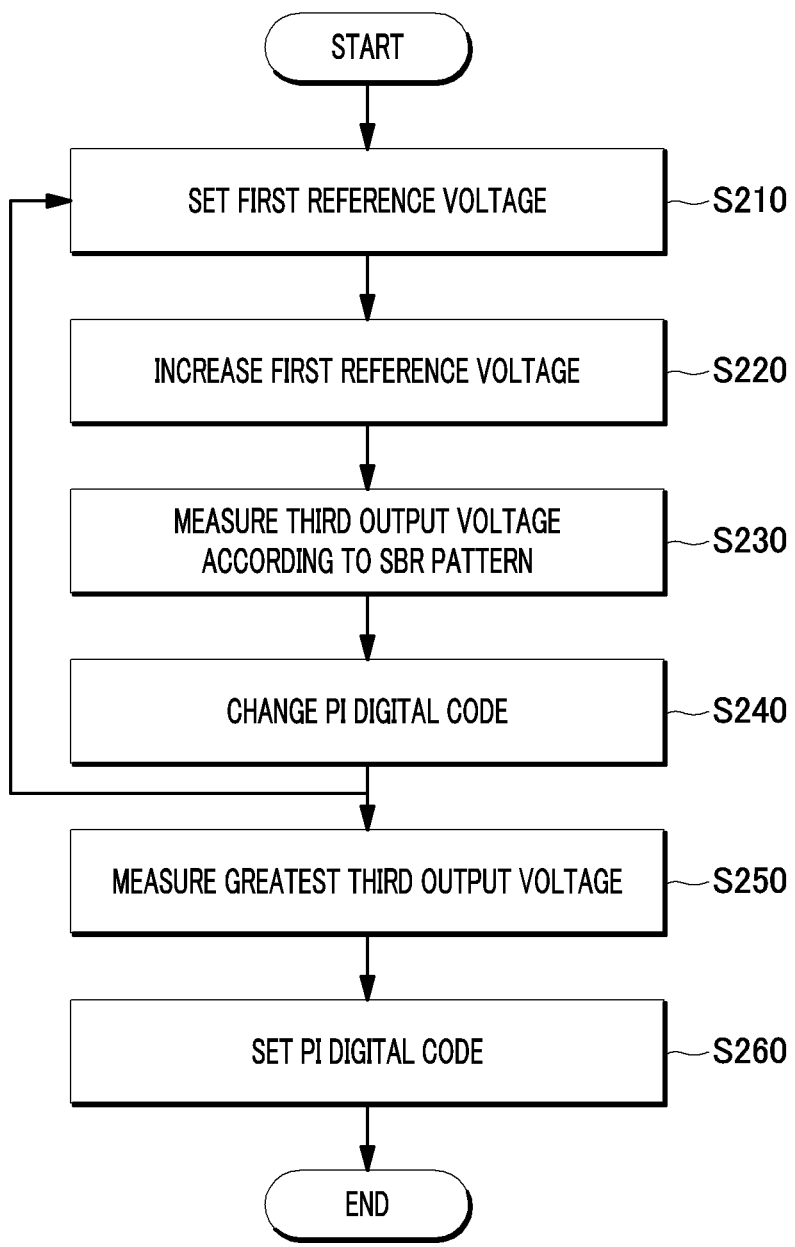
FIG. 12 is a flowchart of a method for setting a phase interpolator (PI) digital code, according to an embodiment.

FIG. 12 is a flowchart of the method for setting the PI digital code according to the embodiment.

The method for setting the reference voltage of the sampler 220 and the method for setting the PI digital code according to FIG. 12 corresponds to a step of centering an eye in which a clock of the sampler 220 is located in the center of an eye diagram of data. In addition, the step of centering the eye may be performed twice. Since eight data channels share one PI, there is a difference between a process of training a first channel and a process of training the remaining seven channels.

First, in order to set a reference voltage of the sampler 220 and a PI digital code of the first channel, a first reference voltage of the sampler 220 is set in step S210. The digital memory block 210 sets an arithmetic mean value of a DC voltage value having the smallest voltage difference between the first output voltages as the first reference voltage. In this case, the set first reference voltage has three values and may be set as the final reference voltage of the sampler 220.

Specifically, four DC voltage values are checked in step S111, step S112, and step S113 in which DC voltages are transmitted in the step of setting the sizes of the transistors in the N-over-N driver 150.

Accordingly, the N-over-N driver 150 sequentially transmits DC voltages corresponding to data of 00, 01, 10, and 11 to the sampler 220. That is, the same data is repeatedly transmitted to the sampler 220. In this case, whenever the DC voltages are transmitted to the sampler 220, the memory control unit 110 notifies the memory digital block 210 of the transmission fact through the side channel 330. In addition, a reference voltage of the sampler 220 is increased, and a first output voltage of the sampler 220 corresponding to each DC voltage is measured.

The memory digital block 210 increases the reference voltage of the sampler 220 and determines that a point at which an output of the sampler 220 changes is the input DC voltage. An input DC voltage value determined by the memory digital block 210 is transmitted to the memory control unit 110 through the side channel 330. In addition, since four DC levels of 00, 01, 10, and 11 are transmitted, the output value is measured by repeating four times.

Then, the memory control unit 110 sets an arithmetic mean value of two adjacent DC voltage values as the reference voltage. In addition, the set reference voltage value is transmitted to the memory digital block 210 through the side channel 330. The memory digital block 210 sets the reference voltage of the sampler 220 by using the received reference voltage value. In this case, the same reference voltage is set to the eight samplers 220 of eight phases. That is, only three reference voltages are set.

In step S220, the digital memory block 210 increases the first reference voltage. In step S230, a third output voltage value of the sampler according to an SBR pattern is measured.

Specifically, the 8-bit pattern generator 120 generates an SBR pattern of 00000001 for both MSB and LSB. In addition, the memory control unit 110 notifies the memory digital block 210 of the fact of SBR pattern transmission through the side channel 330. Accordingly, the memory digital block 210 changes the reference voltage and measures the third output voltage value of the sampler according to the SBR pattern.

In this case, since a transmission period of data and a sampling period of the sampler 220 are equal to each other as eight phases, an input value of the sampler 220 is maintained constant. In addition, the memory digital block 210 increases from a high reference voltage among the three first reference voltages derived in step S210. In addition, when the output voltage value of the sampler 220 is zero, the reference voltage value is measured as the third output voltage value.

In step S240, the digital memory block 210 changes a PI digital code value. After the third output voltage value is measured, the measured value is transmitted to the memory control unit 110 through the side channel 330.

Then, the memory control unit 110 changes digital code values of the phase interpolator 176 from 0 to 511 by one. One UI has a resolution of 6 bits. Accordingly, a phase difference corresponding to a total of 8 UIs may be made into a 9-bit control signal.

In step S250, the third output voltage value of the sampler 220 according to the change in the PI digital code value and the SBR pattern is repeatedly measured. In addition, the PI digital code value having a greatest value among the third output voltage values is set as the final PI digital code value.

Figure 13:
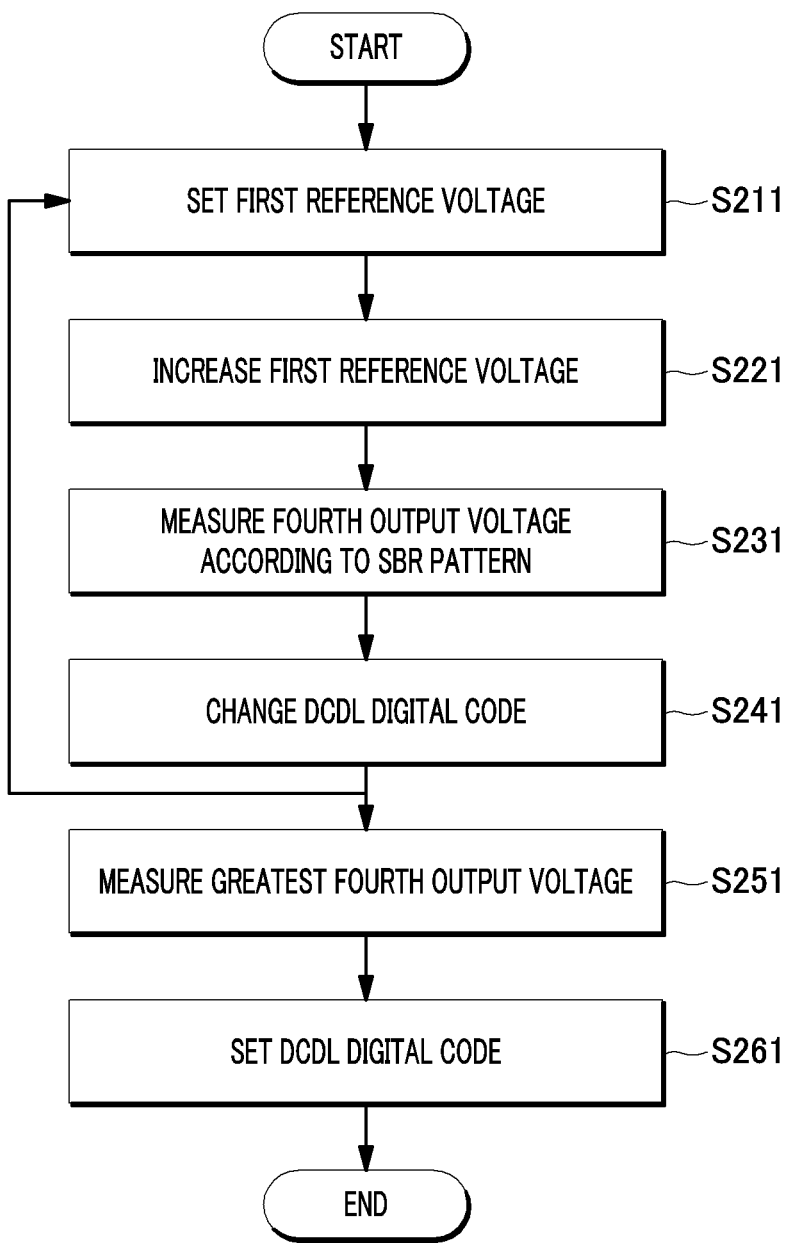
FIG. 13 is a flowchart of a method for setting a delay line (DCDL) digital code, according to an embodiment.

FIG. 13 is a flowchart of a method for setting a DCDL digital code according to an embodiment.

Referring to FIG. 13, a process of setting a DCDL digital code value of is illustrated. After performing training of the first channel through the steps of FIG. 12 described above, the DCDL digital code value is set to perform training of the remaining seven channels.

Step S211 to step S231 are the same as step S210 to step S230 described above. Accordingly, in step S211, the digital memory block 210 sets an arithmetic mean value of the DC voltage values having the smallest voltage difference between the first output voltages as the first reference voltage. In step S221, the memory digital block 210 increases the reference voltage from a high value among the three first reference voltages derived in step S210.

In addition, in step S231, the 8-bit pattern generator 120 generates an SBR pattern of 00000001 for both MSB and LSB. In addition, the memory control unit 110 notifies the memory digital block 210 of the SBR pattern transmission fact through the side channel 330. Accordingly, the memory digital block 210 changes the reference voltage and measures a fourth output voltage value of the sampler according to the SBR pattern.

In step S241, a value of the 3-bit digital code of delay line (DCDL) 140 is changed. Then, in step S251, the fourth output voltage value of the sampler 220 according to the DCDL digital code change and the SBR pattern is repeatedly measured.

In step S261, a value of the DCDL digital code having a greatest value among the fourth output voltage values is set as a final DCDL digital code value. Accordingly, after training of the first channel is performed, training of the remaining seven channels may be performed by setting the DCDL digital code value.

Hereinafter, a method for setting a transistor in the FFE 160 according to the embodiment will be described with reference to FIG. 14.

Figure 14:
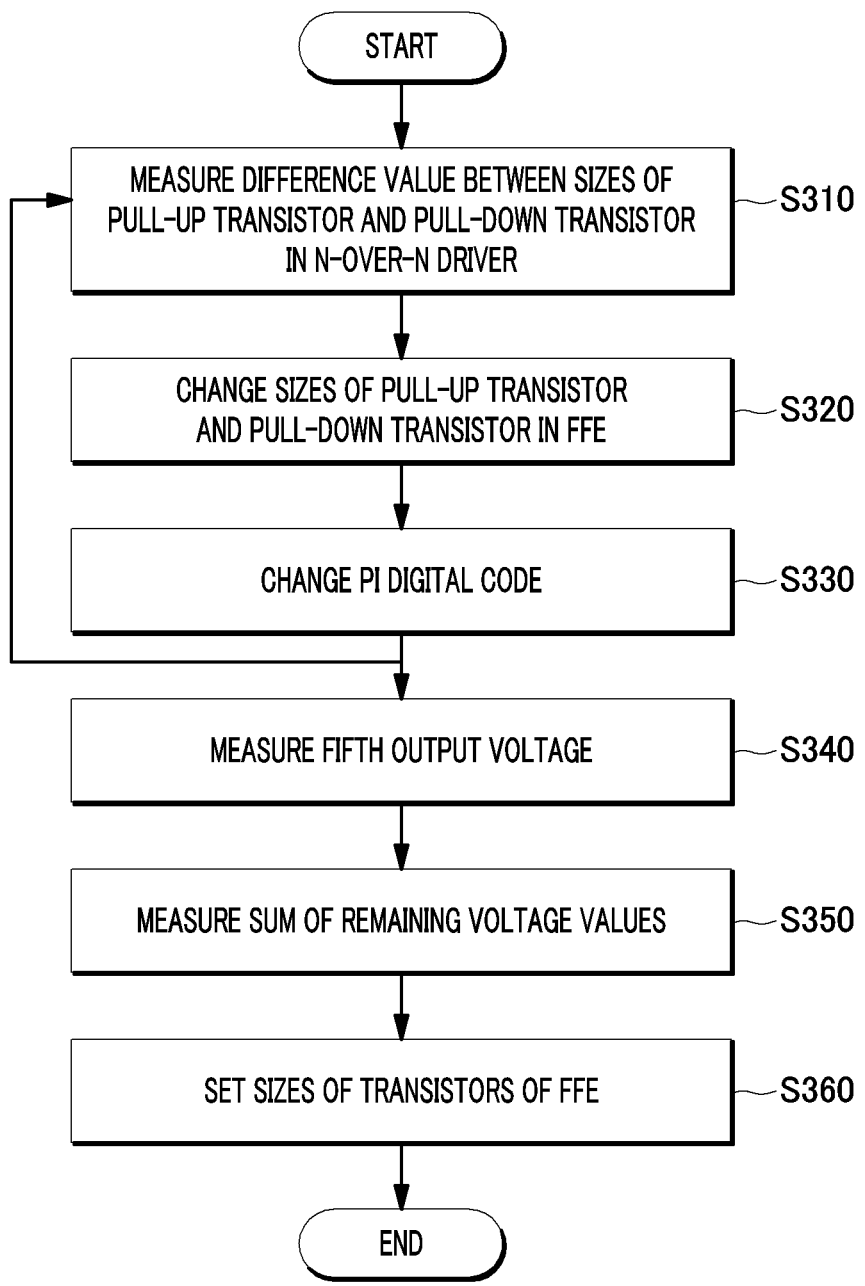
FIG. 14 is a flowchart of a method for setting up a feed forward equalizer (FFE) transistor.

FIG. 14 is a flowchart of a method for setting an FFE transistor according to an embodiment.

Referring to FIG. 14, a method for setting sizes of transistors in the FFE 160 is illustrated. Sizes of a pull-up transistor and a pull-down transistor of the N-over-N driver 150 are derived according to the method described above with reference to FIGS. 8 to 11.

Accordingly, while maintaining a difference between sizes of the pull-up transistor and the pull-down transistor of the N-over-N driver 150, an optimal value is derived by changing the pull-up transistor and the pull-down transistor of the FFE 160. In addition, the FFE 160 may control the pull-up transistor and the pull-down transistor with 5 bits in the same manner as the N-over-N driver 150.

In step S310, a difference between sizes of the pull-up transistor and the pull-down transistor of the N-over-N driver 150 derived according to the method described above with reference to FIGS. 8 to 11 is measured.

In step S320, while maintaining the difference between the sizes of the pull-up transistor and the pull-down of the N-over-N driver 150, sizes of the pull-up transistor and the pull-down transistor of the FFE 160 are changed.

For example, it is assumed that digital control signals corresponding to final size values of the pull-up transistor and the pull-down transistor of the N-over-N driver 150 are 18 and 12. The FFE 160 changes sizes of the transistors of the FFE 160 while maintaining 6 which is a difference value between the digital control signals. The digital control signals corresponding to the sizes of the transistors may be set from 0 to 31. Accordingly, a size of a pair of the pull-up transistor and pull-down transistor in the FFE 160 may be changed from (6,0) to (31,25). In addition, in step S320, the digital control signal corresponding to the size of the transistor may be increased by one.

In step S330, the PI digital code value is changed by 64 from the final PI digital code value described above.

In step S340, a fifth output voltage value of the sampler 220 is repeatedly measured according to the sizes of the pull-up transistor and the pull-down transistor in the FFE 160 and the change of the PI digital code value.

In step S350, the sum of the remaining voltage values except for the greatest voltage value among the measured fifth output voltage values is measured. Specifically, steps S340 and S350 are steps of finding a value in which the sum of the remaining cursors except for a main cursor (the greatest voltage value) is the smallest in an output graph according to the SBR pattern.

In step S360, sizes of the pull-up transistor and the pull-down transistor of the FFE 160 corresponding to a case in which the sum of the remaining voltage values is the smallest is set as the final size of the transistor of the FFE 160.

By performing the above steps, sizes of the transistors in the N-over-N driver 150, sizes of the transistors in the FFE 160, a PI digital code, a DCDL digital code, and a reference voltage of the sampler 220 may be set. According to the set values, the memory may reduce most power consumed by the pin.

In addition, as described above, only one sampler is used for each channel in the steps of setting the sizes of the transistors in the N-over-N driver 150, the sizes of the transistors in the FFE 160, the PI digital code, the DCDL digital code, and the reference voltage of the sampler 220. In addition, when a training process for one channel is completed, training of the next channel is performed, and thus, a total of eight iterations are performed. Accordingly, during step S400 described above, the memory control unit 110 and the memory digital block 210 correct an error of the sampler 220.

In addition, when step S400 is performed for all eight channels, power of the memory control unit 110 is cut off, and thus, it is possible to reduce power consumption.

An embodiment of the present disclosure may also be implemented in the form of a recording medium including instructions executable by a computer such as a program module executed by the computer. A computer-readable medium may be any available medium that may be accessed by a computer and include all of volatile and nonvolatile media and removable and non-removable media. In addition, the computer-readable medium may include a computer storage medium. The computer storage medium includes all of volatile and nonvolatile media and removable and non-removable media implemented by any method or technology for storing information such as computer readable instructions, data structures, program modules or other data.

Although the method and system of the present disclosure are described with reference to specific embodiments, some or all of their components or operations may be implemented by using a computer system having a general-purpose hardware architecture.

The above description of the present disclosure is for illustration, and those skilled in the art to which the present disclosure belongs will be able to understand that it may be easily modified into other specific forms without changing the technical idea or essential features of the present disclosure. Therefore, it should be understood that the embodiments described above are illustrative in all respects and not restrictive. For example, each component described as a single type may be implemented in a distributed form, and likewise components described as distributed may be implemented in a combined form.

A method and an apparatus for optimizing memory power according to an embodiment of the present disclosure may secure linearity of an N-over-N driver when a PAM-4 signal processing method is applied to a high-bandwidth memory (HBM) interface.

In addition, the method and the apparatus for optimizing memory power according to an embodiment of the present disclosure may optimize the power of the HBM.

The scope of the present disclosure is indicated by the following claims rather than the above detailed description, and all changes or modifications derived from the meaning and scope of the claims and their equivalent concepts should be interpreted as being included in the scope of the present disclosure.

What is claimed is:

1. A method for optimizing memory power using a PAM-4 (Pulse-Amplitude Modulation-4) method, comprising:
   setting a ratio and sizes of a pull-up NMOS transistor and a pull-down NMOS transistor included in an N-over-N driver according to a smallest size of a plurality of eyes included in an eye diagram of a memory; and
   setting a reference voltage of a sampler and a phase interpolator (PI) digital code value included in the memory by using a signal bit response (SBR) pattern,
   wherein the N-over-N driver includes a plurality of pull-up NMOS transistors and a plurality of pull-down NMOS transistors, each of the pull-up transistors and the pull-down transistors having a binary size, and
   wherein the ratio and sizes of the pull-up NMOS transistor and the pull-down NMOS transistor is determined by selecting one or more pull-up transistors or one or more pull-down transistors from among the plurality of pull-up transistors and the plurality of pull-down transistors.

2. The method of claim 1, wherein the setting of the ratio and the sizes of the pull-up NMOS transistor and the pull-down NMOS transistor comprises:
   sequentially transmitting DC voltages corresponding to data of 00, 01, 10, and 11 from the N-over-N driver to the sampler;
   increasing the reference voltage of the sampler and measuring a first output voltage of the sampler corresponding to each of the DC voltages;
   setting a voltage difference value having a smallest voltage difference of the first output voltage as a first voltage difference value;
   repeating the measurement of the first voltage difference value by changing the size of the pull-down NMOS transistor; and
   setting the size of the pull-down NMOS transistor having a greatest value among the measured first voltage difference values as a size of a final pull-down NMOS transistor.

3. The method of claim 2, wherein the setting of the ratio and the size of the pull-up NMOS transistor and the pull-down NMOS transistor further comprises:
   repeatedly measuring a second output voltage of the sampler by changing the size of the pull-up NMOS transistor and the reference voltage of the sampler; and
   setting the size of the pull-up NMOS transistor at a point in time when a sign of the second output voltage is inverted to a size of the final pull-up NMOS transistor.

4. The method of claim 3, wherein the setting of the reference voltage of the sampler and the phase interpolator (PI) digital code value further comprises:
   setting an arithmetic mean value of DC voltage values having a smallest voltage difference of the first output voltage as a first reference voltage; and
   setting the first reference voltage as a final reference voltage of the sampler.

5. The method of claim 4, wherein the setting of the reference voltage of the sampler and the phase interpolator (PI) digital code value further comprises:
   increasing the first reference voltage and measuring a third output voltage value of the sampler according to the SBR pattern;
   changing the PI digital code value and repeatedly measuring the third output voltage value of the sampler according to the SBR pattern; and
   setting the PI digital code value having a greatest value among the measured third output voltage values as a final PI digital code value.

6. The method of claim 5, wherein the setting of the reference voltage of the sampler and the phase interpolator (PI) digital code value further comprises:
   increasing the first reference voltage value and measuring a fourth output voltage value of the sampler according to the SBR pattern;
   changing a delay line (DCDL) digital code value and repeatedly measuring the fourth output voltage value of the sampler according to the SBR pattern; and
   setting the DCDL digital code value having a greatest value among the measured fourth output voltage values as a final DCDL digital code value.

7. The method of claim 6,
   wherein the setting of the ratio and the sizes of the pull-up NMOS transistor and the pull-down NMOS transistor further comprises setting a ratio and sizes of a pull-up NMOS transistor and a pull-down NMOS transistor of the feed forward equalizer (FFE), and
   wherein the setting of the ratio and the sizes of the pull-up NMOS transistor and the pull-down NMOS transistor of the FFE comprises:
   changing the sizes of the pull-up NMOS transistor and the pull-down NMOS transistor of the FFE while maintaining a difference value between the sizes of the pull-up NMOS transistor and the pull-down NMOS transistor of the N-over-N driver;
   changing the PI digital code value by 64 from the final PI digital code value;
   repeatedly measuring a fifth output voltage value of the sampler according to the sizes of the pull-up NMOS transistor and the pull-down NMOS transistor of the FFE and the change of the final PI digital code value;

measuring a sum of remaining voltage values excluding a greatest voltage value among the measured fifth output voltage values; and setting the sizes of the pull-up NMOS transistor and the pull-down NMOS transistor of the FFE corresponding to a case in which the sum of the remaining voltage values is the smallest as a size of the final NMOS transistor of the FFE.

8. An apparatus for optimizing memory power which uses pulse-amplitude modulation-4 (PAM-4) method, the apparatus comprising:

a memory controller configured to set a ratio and sizes of a pull-up NMOS transistor and a pull-down NMOS transistor included in an N-over-N driver according to a smallest size of a plurality of eyes included in an eye diagram of a memory; and a memory digital block configured to set a reference voltage of a sampler and a phase interpolator (PI) digital code value included in the memory by using a signal bit response (SBR) pattern, wherein the N-over-N driver includes a plurality of pull-up NMOS transistors and a plurality of pull-down NMOS transistors, each of the pull-up transistors and the pull-down transistors having a binary size, and wherein the ratio and sizes of the pull-up NMOS transistor and the pull-down NMOS transistor is determined by selecting one or more pull-up transistors or one or more pull-down transistors from among the plurality of pull-up transistors and the plurality of pull-down transistors.

9. The apparatus of claim 8, wherein the memory controller sets the ratio and the sizes of the pull-up NMOS transistor and the pull-down NMOS transistor, sequentially transmits DC voltages corresponding to data of 00, 01, 10, and 11 from the N-over-N driver to the sampler, increases the reference voltage of the sampler and measuring a first output voltage of the sampler corresponding to each of the DC voltages, sets a voltage difference value having a smallest voltage difference of the first output voltage as a first voltage difference value, repeats the measurement of the first voltage difference value by changing the size of the pull-down NMOS transistor, and sets the size of the pull-down NMOS transistor having a greatest value among the measured first voltage difference values as a size of a final pull-down NMOS transistor.

10. The apparatus of claim 9, wherein the memory controller sets the ratio and the size of the pull-up NMOS transistor and the pull-down NMOS transistor, repeatedly measures a second output voltage of the sampler by changing the size of the pull-up NMOS transistor and the reference voltage of the sampler, and sets the size of the pull-up NMOS transistor at a point in time when a sign of the second output voltage is inverted to a size of the final pull-up NMOS transistor.

11. The apparatus of claim 10, wherein the memory digital block sets an arithmetic mean value of DC voltage values having a smallest voltage difference of the first output voltage as a first reference voltage, and sets the first reference voltage as a final reference voltage of the sampler.

12. The apparatus of claim 11, wherein the memory digital block increases the first reference voltage and measuring a third output voltage value of the sampler according to the SBR pattern, changes the PI digital code value and repeatedly measuring the third output voltage value of the sampler according to the SBR pattern, and sets the PI digital code value having a greatest value among the measured third output voltage values as a final PI digital code value.

13. The apparatus of claim 12, wherein the memory digital block increases the first reference voltage value and measuring a fourth output voltage value of the sampler according to the SBR pattern, changes a delay line (DCDL) digital code value and repeatedly measuring the fourth output voltage value of the sampler according to the SBR pattern, and sets the DCDL digital code value having a greatest value among the measured fourth output voltage values as a final DCDL digital code value.

14. The apparatus of claim 13, wherein the memory controller changes the sizes of the pull-up NMOS transistor and the pull-down NMOS transistor of the FFE while maintaining a difference value between the sizes of the pull-up NMOS transistor and the pull-down NMOS transistor of the N-over-N driver, changing the PI digital code value by 64 from the final PI digital code value, repeatedly measures a fifth output voltage value of the sampler according to the sizes of the pull-up NMOS transistor and the pull-down NMOS transistor of the FFE and the change of the final PI digital code value, measures a sum of remaining voltage values excluding a greatest voltage value among the measured fifth output voltage values, and sets the sizes of the pull-up NMOS transistor and the pull-down NMOS transistor of the FFE corresponding to a case in which the sum of the remaining voltage values is the smallest as a size of the final NMOS transistor of the FFE.

* * * * *